United States Patent [19]

Fettig

[11] 4,405,191

[45] Sep. 20, 1983

[54] LOW INSERTION FORCE ACTUABLE INTERFACE FOR ELECTRICAL CONTACTS

[75] Inventor: Lyle A. Fettig, La Verne, Calif.

[73] Assignee: Everett/Charles Test Equipment, Inc., Pomona, Calif.

[21] Appl. No.: 197,973

[22] Filed: Oct. 17, 1980

[51] Int. Cl.[3] .................... G01R 15/12; H01R 13/629

[52] U.S. Cl. ............................. 339/75 M; 324/158 F; 308/3.8

[58] Field of Search ............. 339/74 R, 75 M, 75 MP, 339/117 P; 308/3.8, 6 R; 312/338-341, 350; 324/158 F, 158 P, 73 PC

[56] References Cited

U.S. PATENT DOCUMENTS

| | | | |
|---|---|---|---|
| 206,648 | 6/1878 | Tucker | 308/6 R |
| 3,353,874 | 11/1967 | Del Vecchio et al. | 308/3.8 |
| 3,466,109 | 9/1969 | Kauffman et al. | 312/338 |
| 3,661,431 | 5/1972 | Wisecarver | 308/6 R |
| 4,230,985 | 10/1980 | Matrone et al. | 339/75 M |

FOREIGN PATENT DOCUMENTS

| | | | |
|---|---|---|---|
| 473026 | 10/1937 | United Kingdom | 308/6 R |

OTHER PUBLICATIONS

IBM Bulletin, Doody, vol. 15, No. 8, pp. 2534–2535, 1-1973.

*Primary Examiner*—Neil Abrams

*Attorney, Agent, or Firm*—Christie, Parker & Hale

[57] ABSTRACT

A low insertion force actuable interface assembly having a carrier mounting an array of electrical contacts and a carrier moving means. The carrier moving means has at least one movable cam member guided for movement in a substantially straight line. The cam member has first and second cam portions for guiding a cam follower. The cam follower in following the first cam part causes the carrier to move the contacts parallel with the axes thereof. A first cam part, connected to the carrier, forces a second cam part, connected for movement with the cam member, to move the carrier substantially transverse to the axes of the contacts while the cam follower follows the second cam portion. The guide means comprises at least one first bearing on the cam member, and at least one second bearing on the cam member. At least one first bearing and at least one second bearing are provided, each being provided oppositely facing on the cam member. At least one first roller is positioned for supporting and rolling along the first bearing and at least one second roller is positioned for supporting and rolling along the second bearing. An interlocked interface is provided between the first roller and the first bearing for substantially preventing movement of the cam member in a transverse direction. The first and second rollers support and guide the cam member along a substantially straight line.

22 Claims, 21 Drawing Figures

100
102
104
106
107
108
110
141
143
144
146
148
160
162
164
190
192
193
194
200
250
252
260
262
270
271
274
276
280
282
284
286
288
290
300
302
304
310
312
314
316
404
1164
1190
1192
1194
1200
1250
1252
1260
1262
1270
1274
1276
1286
1288
1290
1300
1302
1304
1310
1312
10

Fig. 14
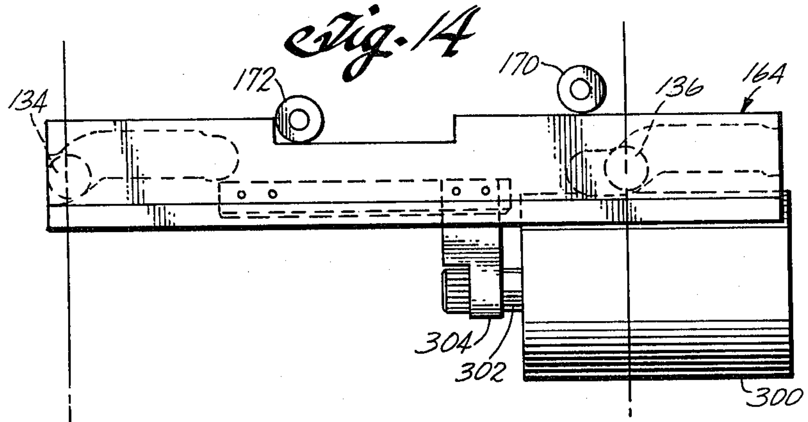
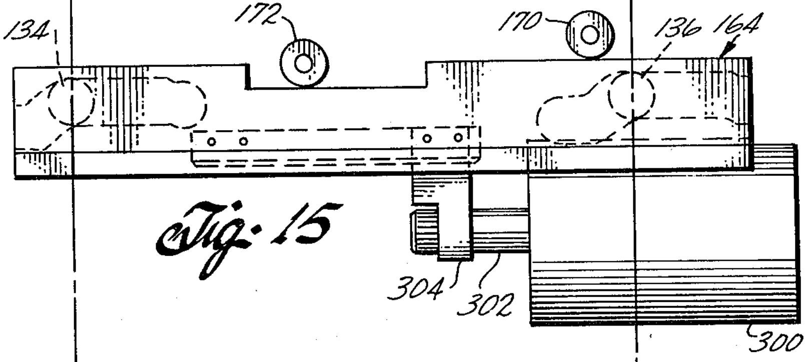
Fig. 15
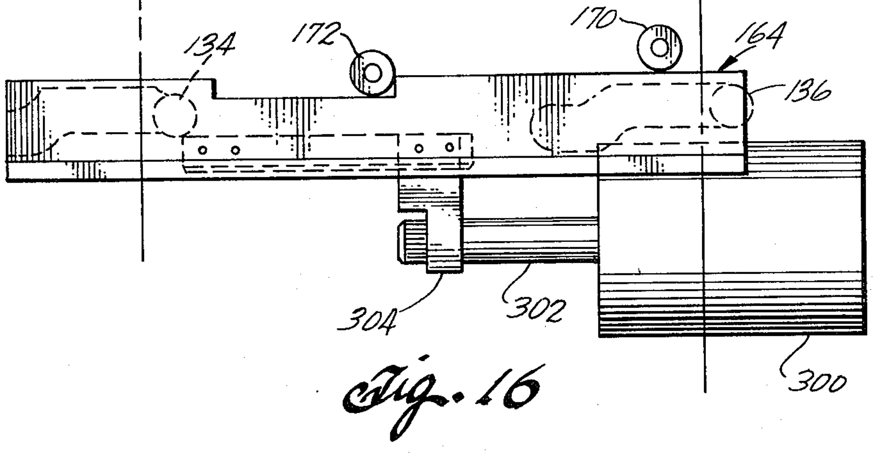
Fig. 16

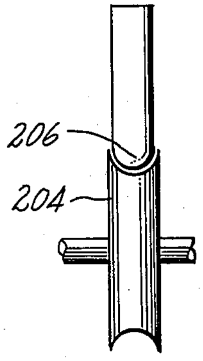
Fig. 17
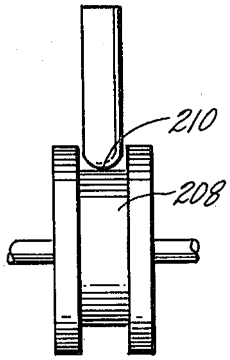
Fig. 18
Fig. 20
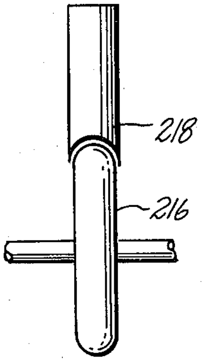
Fig. 19
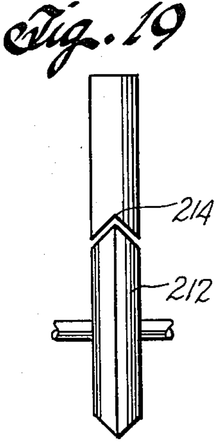
Fig. 21
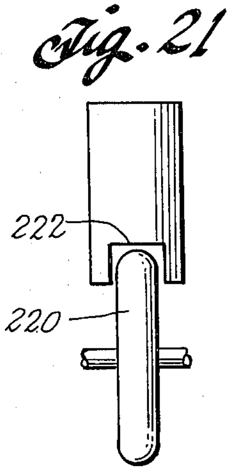

LOW INSERTION FORCE ACTUABLE INTERFACE FOR ELECTRICAL CONTACTS

BACKGROUND OF THE INVENTION

This invention relates to low insertion force interface connectors and more particularly to apparatus for moving an array of electrical contacts into engagement with a second array of electrical contacts.

Fixture systems are generally known which include an actuator assembly for relatively moving a plurality of electrical test probes and a printed circuit board into electrical contact. Many of these devices employ an interchangeable test head carrying the electrical test probes. Due to the interchangeability of the test head it is necessary to provide an interface connector system for making electrical connection with the rest of the circuit board verifier as the interchangeable test head is inserted into the fixture system.

To this end, interchangeable test heads have also been provided with interface pins, one interface pin for each of the possible positions of the test probes on the interchangeable test head and an electrical connection is made between the probes and the corresponding interface pins. Additionally a set of interface contacts are provided in the fixture system and are electrically connected to a circuit board verifier. The interface pins and the interface contacts are arranged in mirror image arrays with one of the contacts in the array of interface contacts corresponding to each one of the interface pins in the array of interface pins. When the interchangeable test head is inserted into the fixture system, an electrical connection is made between each interface pin and the corresponding interface contact.

Various arrangements have been devised for bringing the interface pins and the interface contacts into engagement to thereby make electrical connection therebetween.

One type of prior art device is disclosed in applicant's copending application titled LOW INSERTION FORCE ELECTRICAL INTERFACE ASSEMBLY AND ACTUABLE INTERFACE ASSEMBLY THEREFOR, Ser. No. 148,537 filed May 9, 1980. In this device a low insertion force actuable interface assembly has a carrier mounting an array of electrical interface contacts. The axes of the contacts are substantially parallel to each other so that each contact extends to a free end. Carrier moving means is provided. The carrier moving means has at least one movable cam member guided for movement in a substantially straight line. The cam member has first and second cam portions. A first cam follower is connected to the carrier and is positioned for following the first and second cam portions for thereby guiding the movement of the carrier during movement of the cam member. The first cam part is connected to the carrier and the second cam part is connected for movement with the cam member. The movement of the cam member causes the cam follower to follow in sequence the first and second cam portions. The cam follower in following the first cam portion causes the carrier to move the contacts substantially parallel with the axes of the contacts. The second cam part forces the first cam part to move the carrier transverse to the axes of the contacts while the cam follower follows the second cam portion.

The guide means for guiding the cam member includes slots which provide a sliding interface between the guides and the cam bar. A disadvantage of such an arrangement is that considerable friction is generated between the sliding parts. Additionally, the cam follower is a shaft which slides along cam surfaces provided in the first and second cam portions. As a result, additional sliding friction is created. Additionally, a guide is provided for guiding the carrier in a vertical direction during the movement of the cam follower along the first cam portion. In the prior art device the guide is a vertically elongated slot in which the aforementioned shaft slides. As a result, additional sliding friction is created. The various components of sliding friction may add substantially to the force required to actuate the cam members and thus cause the two movements of the carrier.

Additionally a second cam member is provided interconnected with the first mentioned cam member so that both cam members move together in parallel. The second cam member also has first and second cam portions. An additional cam follower is provided for following the first and second cam portions of the second cam member similar to that described with reference to the first mentioned cam member. A side thrust camming arrangement forces the carrier to move in its transverse movement, not only transverse to the axes of the contacts but transverse to the direction of movement of the cam members. Since many contacts are involved, i.e., in the order of 8,000, the mating contacts will exert a substantial force on the contacts and thus on the carrier. As a result the carrier tends to tip unless adequate tolerances and precautions are used to prevent the tipping. The problem is compounded by present needs to increase the number of contacts to the order of 16,000 contacts.

Additionally the side thrust camming arrangement is provided between the cam member and the carrier. The side thrust camming arrangement includes two inclined surfaces which engage and slide in order to force the carrier to move in the direction transverse to the axes of the contacts. The inclined surfaces produce additional sliding friction.

SUMMARY OF THE INVENTION

Briefly, an embodiment of the present invention is a low insertion force actuable interface assembly having a carrier mounting an array of electrical contacts. The axes of the contacts are substantially parallel to each other so that each contact extends to a free end. A carrier moving means is provided. The carrier moving means has at least one movable cam member guided for movement in a substantially straight line. The cam member has first and second cam portions. A cam follower is connected to the carrier and is positioned for following the first and second cam portions for thereby guiding the movement of the carrier during the movement of the cam member. A first cam part is connected to the carrier and a second cam part is connected for movement with the cam member. The movement of the cam member causes the cam follower to follow in sequence the first and second cam portions. The cam follower in following the first cam portion causes the carrier to move the contacts substantially parallel with the axes thereof. The second cam part forces the first cam part to move the carrier substantially transverse to the axes of the contacts while the cam follower follows the second cam portion.

Significantly, guide means is provided for supporting and guiding the movable cam member along a substantially straight line. The guide means includes a first bearing on the cam member and a second bearing on the cam member which are substantially oppositely facing. Also included are first and second rollers. The first roller is positioned for supporting and rolling along the first bearing whereas the second roller is positioned for supporting and rolling along the second bearing. An interlocked interface is provided between the first roller and the first bearing for substantially preventing movement of the cam member transverse to the substantially straight line. The first and second rollers support and guide the cam member along the substantially straight line. Such an arrangement minimizes friction in the guide for the cam member.

Preferably the interlock is a recess in one of the first roller and the first bearing elements and the other element extends into the recess. Also preferably the recess or extension extends around the perimeter of the first roller. Preferably a third rotatably mounted roller is positioned for rolling along one of the first and second bearings during movement of the cam member. Two out of three of the rollers are positioned for rolling along one of the bearings and the remaining roller is positioned for rolling along the other bearing. The rollers are positioned in a triangular relationship wherein the axis of each of the two rollers for one of the bearings is positioned on opposite sides of a line normal to the bearings and passing through the axis of rotation of the remaining roller. With such an arrangement a very stable low friction support and guide is provided for the cam member.

Also preferably the axes of rotation of the two rollers which are for one of the bearings are spaced substantially equal distances on opposite sides of the line extending through the axis of rotation of the remaining roller, further contributing to the stability of the guide arrangement. Preferably the second bearing has a substantially flat bearing surface and the second roller comprises a substantially cylindrical shaped bearing surface for rolling along such surface during movement of the cam member.

According to a preferred arrangement there is a fourth rotatably mounted roller for rolling along the first bearing to thereby add further stability to the guided cam member. Preferably the fourth roller and the first bearing also have an interlocked interface therebetween to prevent lateral movement of the cam member.

Preferably the second bearing has spaced apart stops which engage the roller on the second bearing to thereby limit the extent of movement of the cam member. Preferably the bearing comprises a depressed portion in the bearing.

The second cam part preferably comprises a rotatable cam. The rotatable cam preferably has a dwell portion which does not move the carrier and an accelerator portion. The accelerator portion acts against the first cam part to move the cam and thereby the carrier transverse to the axes of the contacts. The dwell portion maintains the carrier in a fixed transverse position relative to the axes of the contacts while the carrier is being moved parallel to the axes of the contacts.

According to a preferred arrangement the first cam part is adjustable relative to the second cam part to thereby adjust the extent of movement of the second cam part and thus adjust the extent of movement of the carrier in a transverse direction.

In order to minimize friction, preferably the cam follower is a roller rotatably mounted to the carrier.

The first and second cam portions are preferably a slot extending only partially into the side of the cam member. The slot thereby confines the cam follower therein.

Preferably means is provided for adjusting the distance between the axis of rotation of the first and second roller. As a result the cam member can be very precisely guided.

A second cam member is provided and is interconnected to the first cam member for movement in parallel therewith. In each of the cam members there are first and second cams which include the above described first and second cam portions. Two cam followers are connected on opposite sides of the carrier, one for following the cam portions on each of the cams in each of the cam members. Guide means is provided for supporting and guiding the second cam member and is of precisely the same type as that discussed above with respect to the first cam member. As a result, not only are the cam members easily movable but a very stable guiding arrangement is provided for the carrier and hence for the contacts.

Preferably the direction of movement of the carrier during its movement transverse to the axes of the contacts is in a direction which is parallel with the movement of the cam members. As a result any tendency of the carrier to tip during the transverse movement may be substantially eliminated.

BRIEF DESCRIPTION OF THE DRAWINGS

FIGS. 14, 15 and 16 are side elevation views of the cam bar, the rollers, the cam followers and the pancake cylinder in, respectively, the initial, partially actuated and fully actuated conditions; and FIGS. 17–21 depict alternate configurations for the interlocked interface between the rollers and the cam bearings.

DETAILED DESCRIPTION OF THE DRAWINGS

Figure 1:
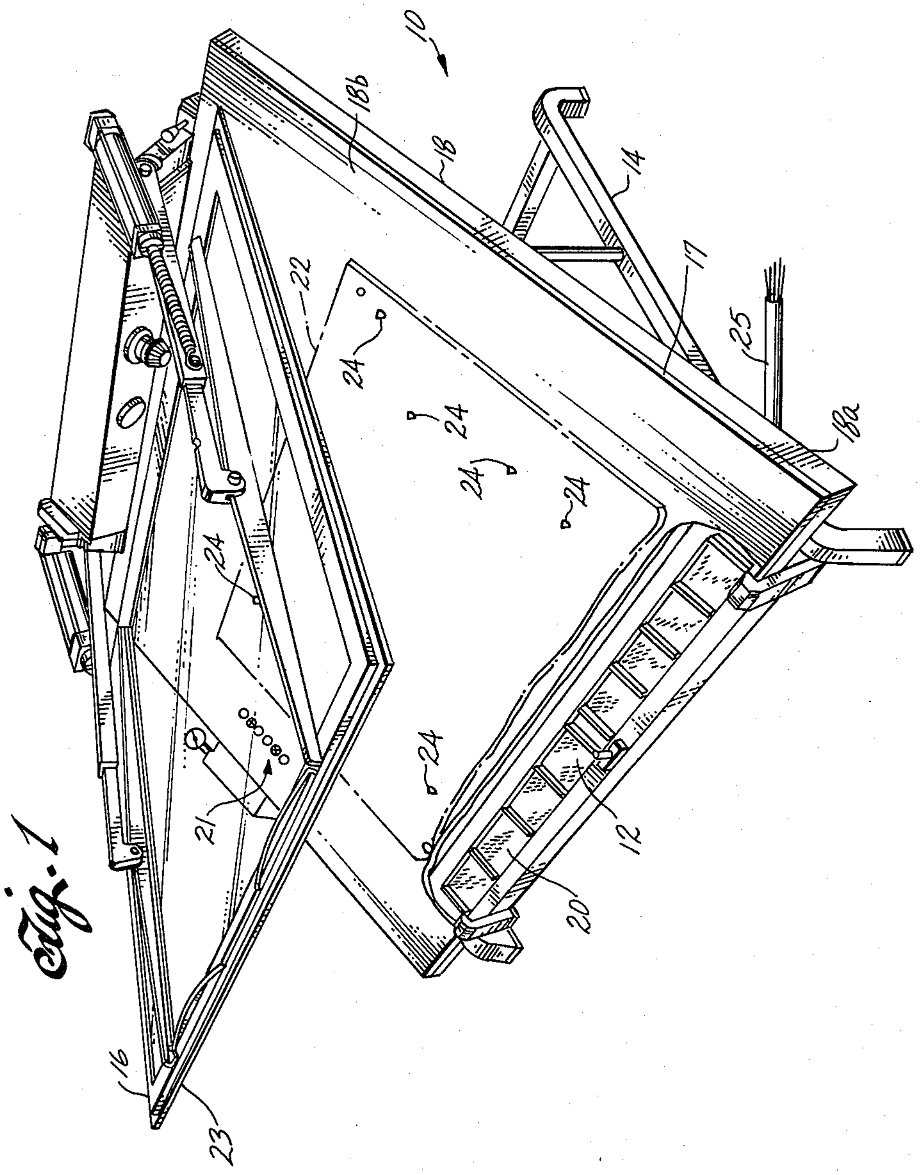
FIG. 1 is a perspective elevation view of the vacuum actuated fixture system for use with a circuit board verifier containing an actuable interface assembly and embodying the present invention.

FIG. 1 depicts a vacuum actuated fixture system 10 including a low insertion force actuable interface assembly (interface assembly) 12 embodying the present invention. The vacuum actuated fixture system 10 includes a support structure 14 on which the interface assembly and a hinged door 16 are mounted. An interchangeable test head 18 is mounted in the support structure 14. Portions of the interchangeable test head 18 are broken away in order to reveal the interface assembly 12 which is located below the interchangeable test head in FIG. 1. To be explained in more detail with reference to FIG. 5, but not shown in FIG. 1, the interchangeable test head 18 has spring contacts mounted on and extending downward from the under side 18*a* of the interchangeable test head 18. Electrical spring contacts 20 are mounted in the interface assembly 12 along an axis to a free end. One contact 20 is provided on the interface assembly 12 corresponding to each contact on the under side of the interchangeable test head 18. The interface assembly is arranged to first move each contact 20 parallel with the axis of the contact 20 (and hence parallel with the axis of the corresponding contact on the under side of the interchangeable test head 18) until each contact 20 is in opposed relation to the corresponding contact on the interchangeable test head, and secondly to move each contact 20 normal to the axis thereof into electrical engagement with the corresponding contact on the interchangeable test head.

The purpose of the vacuum actuated fixture system is to probe electrical test points on printed circuit boards. To this end a printed circuit board 22 is schematically depicted by broken line on the upper surface 18*b* of the interchangeable test head 18. An array of spring probes 24 extends through an upper plate 17 of the interchangeable test head within the dotted outline for the printed circuit board 22. The lower end (not seen) of each of the spring probes 24 is electrically connected by a wire (not shown) to a different one of the contacts on the under side of the interchangeable test head. When a printed circuit board is positioned as indicated at 22 and the hinged door 16 is closed against the upper surface 18*b* of the interchangeable test head, a seal is formed between the door and surface 18*b* by a flexible seal 23 around the perimeter of the door. Vacuum is then created between the door 16 and the upper surface 18*b* through ports 21 in the interchangeable test head, causing the flexible seal 23 to collapse and causing the door to be drawn against the printed circuit board 22, forcing the printed circuit board 22 into good electrical contact with each of the spring probes 24. As a result, electrical connections are provided between test points on the printed circuit board, through the spring probes to the contacts (not shown) on the under side of the interchangeable test head, through the corresponding contacts 20 in the interface assembly 12 to a cable 25 which in turn may be connected to a circuit verifier to verify that proper electrical connection exists between the various test points on the printed circuit board under test.

Figure 2:
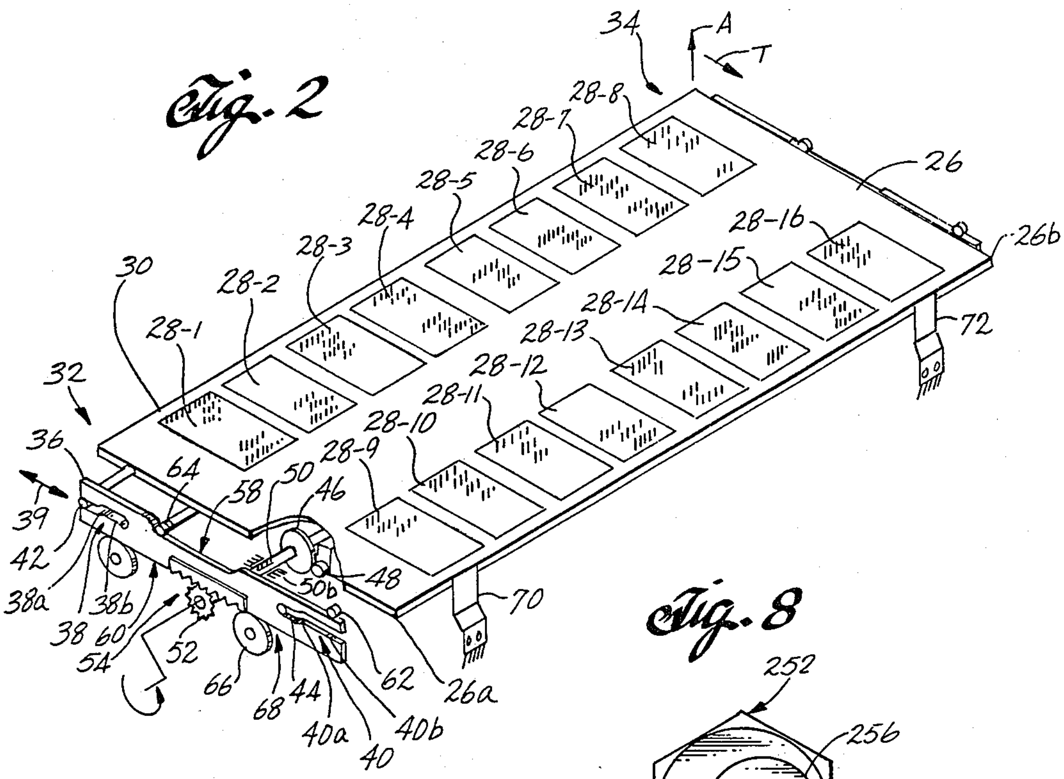
FIG. 2 is a pictorial and schematic view illustrating the operation of the actuable interface assembly.
Figure 8:
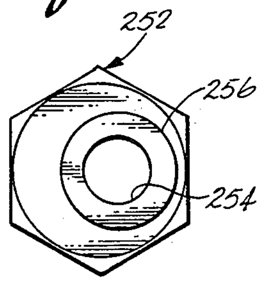
FIG. 8 is an end view of the eccentric dual V guide adapter taken from the left hand side of FIG. 5.
Figure 9:
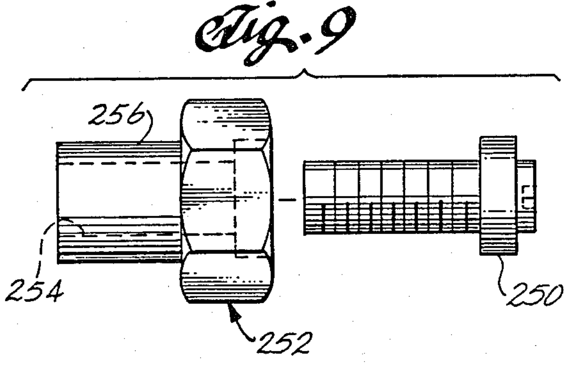
FIG. 9 is a side elevation and exploded view of the eccentric dual V guide adapter and machine screw for use in the actuable interface assembly of FIG. 4 for mounting the dual V guide.

FIG. 2 is a schematic and block diagram of an interface assembly provided for the purpose of illustrating certain aspects of the construction and operation of the present invention. The interface assembly of FIG. 2 includes a carrier 26 in which are mounted 16 groups of electrical contacts 30 identified as groups 28–1 through 28–16. Each contact is mounted in and extends through the carrier from a bottom end (not shown), which is exposed at the lower side of carrier 26, to an upper free end. The upper end of each contact 30 is an electrical leaf spring type contact which is effectively cantilever mounted in the carrier and has an axis which extends parallel with the arrow A.

The carrier 26 has associated therewith carrier moving means 32 and 34 which cause the carrier 26 to first move substantially parallel with the axis of each of the contacts 30 and then in a direction transverse to the axes of the contacts. The first movement is depicted by arrow A and the second movement is indicated by arrow T.

By way of example, a total of 16,768 contacts are provided, 1048 contacts in each group, and all of the contacts in each group are arranged in a rectangular X-Y coordinate array of rows and columns; only a few of the contacts 30 are depicted by generally vertical lines in FIG. 2 but more are understood to be present.

The carrier moving means includes carrier moving portion 32 and carrier moving portion 34 which are located at opposite sides 26*a* and 26*b* of the generally rectangular shaped carrier 26. To be explained in more detail, the carrier moving portions 32 and 34 are interconnected by means of a cam shaft 50. Carrier moving portions 32 and 34 are generally the same and a mirror image of each other. For simplicity, only carrier moving portion 32 will now be explained.

Carrier moving portion 32 includes an elongated cam bar or cam member 36. The cam member 36 is guided for reciprocal movement in a substantially straight line as indicated by arrows 39. The cam member 36 includes cams 38 and 40 preferably formed as slots in the side of the cam member. The cam 38 includes a portion 38*a* which extends at a generally acute angle to the axis of each of the contacts 30 (which contacts are parallel with arrow A) and a portion 38*b* which extends generally transverse to the axis of each of the contacts 30 (i.e., in a direction parallel with arrow A). Similarly, cam 40 has a portion 40*a* and a portion 40*b* which are substantially the same shape as cam portions 38*a* and 38*b*. Cam followers 42 and 44 are connected to the carrier 26 and follow the surfaces of cam portions 38*a*, 38*b* and 40*a*, 40*b* of the cams 38 and 40 as the cam member 36 is moved in a straight line as indicated at 39. The carrier moving portion 32 includes a linear accelerator cam 46 affixed to the cam shaft 50. A cam follower for the accelerator cam 46 is depicted at 48 and is connected to the under side of carrier 26.

A spur gear 52 is affixed to and is carried with rotation of the cam shaft 50 and has teeth which engage the teeth on a linear gear rack 54. The linear gear rack 54 is connected to a side of the cam member 36.

Significantly, the carrier moving portion 32 includes guide means for supporting and guiding the movable cam member 36 along the straight line indicated by arrows 39. Significantly, the guide means includes a surface or bearing 58 generally indicated along the upper edge of the cam member 36 and a bearing 60 generally indicated along the lower edge of the cam member 36. Also included are rollers 62 and 64 for supporting and rolling along the bearing 58 and a roller 66 for supporting and rolling along the lower bearing 60.

An interlock interface 68 is provided between the roller 66 and the lower bearing 60 for substantially preventing movement of the cam member in a transverse direction to the line of movement of cam member 36. The axes of rotation of the rollers 62, 64 and 66 are fixed relative to each other so that a force is formed therebetween through the cam member to thereby accurately support and guide the cam member along the straight line.

Preferably the interlock 68 between the roller 66 and the bearing 60 comprises a recess, preferably a V-shaped groove, around the outer periphery of the roller 66 and a protruding, preferably V-shaped cross-section in the bearing 60 of the cam member 36. As mentioned above, the carrier portion 34 is essentially the same and is a mirror image of carrier portion 32. Further, the spur gear and cam (not shown) of carrier portion 34 corresponding to 52 and 46 are affixed to and rotate with shaft 50 and as a result the cam bars in the portions 32 and 34 move together and in parallel.

Consider now briefly the operation of the interface assembly depicted in FIG. 2. The cam member 36 is initially positioned as seen in FIG. 2 in a deactuated condition. In the deactuated condition the carrier 26 and contacts 30 are positioned fully down (i.e., opposite to arrow A) and to the left (i.e., opposite to arrow T) as seen in FIG. 2. For actuation the cam member 36 is moved generally to the left as depicted in FIG. 2 along the straight line 39. This movement can be caused either by a rotational force applied to the cam shaft 50 or by a force applied directly to the cam member 36. Vertical and horizontal movement of cam shaft 50 is prevented by bearings which rotatably mount shaft 50, shown schematically as **50*b* in FIG. 2. Cam follower 48 is affixed to carrier 26. Therefore, rotation of cam shaft 50 linearly moves cam member 36 along line 39 and, to be explained, causes linear accelerator cam 46 to rotate and eventually force can follower 48 and carrier 26 to move towards the lower right hand corner of FIG. 2. As the cam member 36 is moved to the left, the rollers 62, 64 and 66 support and guide the cam member 36 so that it moves along the substantially straight line, Significantly, the rollers 62, 64 and 66 are all mounted on roller bearings and similarly the cam followers 42 and 44 are rollers on roller bearings, thereby eliminating virtually all sliding forces on the cam member, causing very low resistance to the movement of the cam member. The cam member 36 reaches a partially actuated condition after the cam followers 42 and 44 have followed the cam portions 38*a* and 40*a* and just reach the top of cam portions 38*a* and 40*a*. Until the cam followers 42, 44 reach the top of cam portions 38*a*, 40*a*, the shape of the accelerator cam 46 is such as to act against cam follower 48 and maintain the position of the carrier so that no movement takes place from left to right in FIG. 2, i.e., in the direction of arrow T. As the cam followers 42 and 44 follow the cam portions 38*a* and 40*a*, they lift the carrier 26 parallel with the axis of each of the contacts 30, i.e., along the line A depicted in FIG. 2**.

. After the partially actuated condition the cam member 36 is moved farther to the left to a fully actuated condition.

The continued movement of the cam member 36 to the left causes the cam followers 42 and 44 to follow along the cam portions **38*b* and 40*b*. At the same time the linear gear rack 54 causes the spur gear 52 to rotate shaft 50 and accelerator cam 46. Since the cam portions 38*b* and 40*b* are essentially transverse to the axis of each of the contacts 30 (i.e., transverse to line A), the carrier 26 does not move farther in a vertical direction. However, during this continued movement, the radius of the accelerator cam 46 starts changing and exerts a force on the cam follower 48, causing the cam follower 48 and hence the carrier 26 to move in a transverse direction to the axis of each of the contacts 30**, i.e., in the direction of arrow T.

Preferably one or more leaf springs such as that depicted at 70 and 72 urge the carrier 26 to the left as depicted in FIG. 2. As a result the carrier 26 is maintained in tight engagement with the outer surface of the accelerator cam 46 during the foregoing operation. Additionally the springs 70 and 72 cause the carrier 26 to return to its initial position depicted in FIG. 2 as the cam member 36 is returned back to the right to the initial position depicted in FIG. 2.

Having considered the construction and operation of the schematic and block diagram of FIG. 2, consider now the details of the preferred embodiment of the interface assembly according to the present invention as depicted in FIGS. 3–10. The interface assembly includes an outer interface assembly frame 100 including a top 140 and four sides 141, 142, 143 and 144. An interface assembly module 102 is mounted within the interface frame 100 (FIGS. 4, 5, 6 and 7).

Figure 6:
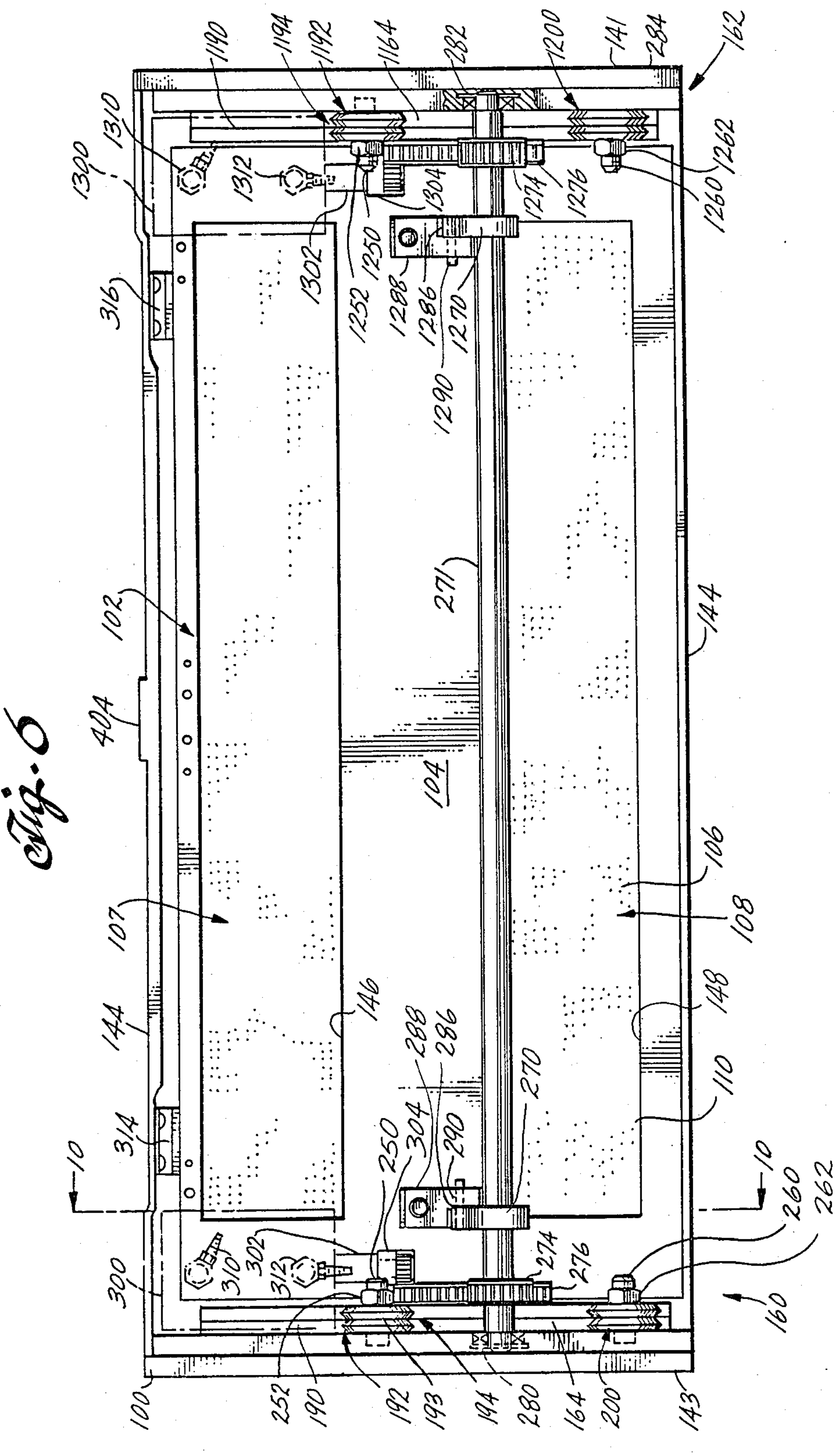
FIG. 6 is a bottom elevation view of the actuable interface assembly taken from the bottom side of FIG. 4.
Figure 7:
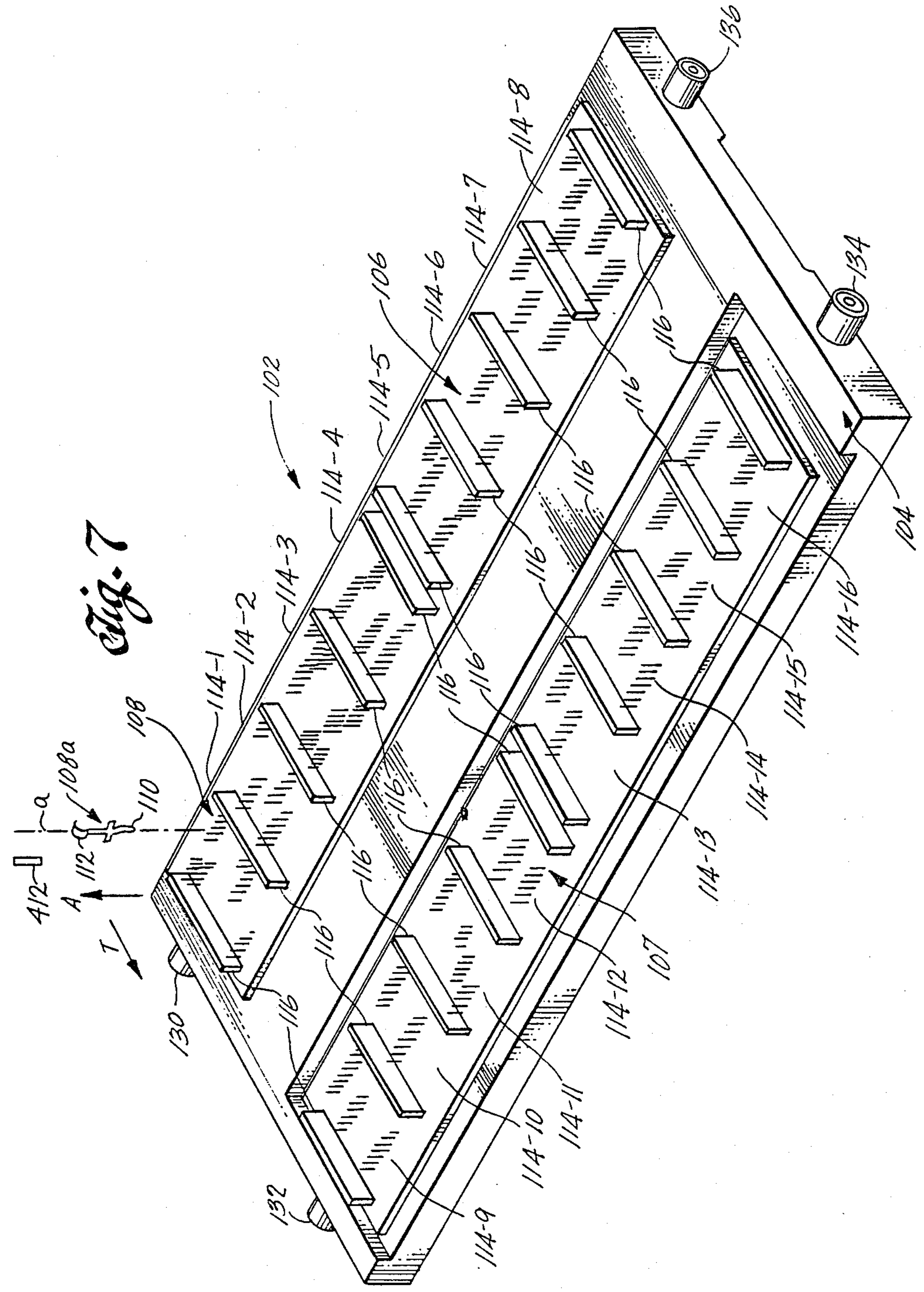
FIG. 7 is a perspective elevation view of the assembly interface module, comprising the carrier and contacts, removed from the actuable interface assembly.

Referring to FIG. 7, which shows the interface module 102 removed from the frame 100, a carrier is provided including a rectangular shaped main frame plate 104 and rectangular shaped assembly contact mounting plates 106 and 107. The contact mounting plates 106 and 107 are made of a nonconductive material such as epoxy glass. A plurality of electrically conductive spring contacts 108 are mounted in and extend completely through each of the mounting plates 106 and 107. Only one spring contact 108 is given a reference number, and others being indicated by similar vertical lines. Each of the contacts 108 is elongated along an axis indicated by broken line "a" in FIG. 7 for contact **108*a*. Contact 108*a* is enlarged and removed from plate 106 for purposes of explanation and is typical of each of the contacts 108. Contact 108*a* includes a lower end 110 which extends and is exposed at the lower surface of the mounting plate 106 and an upper free end 112 for extending upward from the upper surface of the contact mounting plate 106. The upper end 112 is in effect cantilever mounted from the plate 106. Each of the other contacts 108 are identical to contact 108*a*. The array of contacts on the plants 106 and 107 are divided into groups of contacts 114–1 through 114–16 by twenty spacer bars 116. The spacer bars 116 are generally rectangular shaped and are mounted on the contact mounting plates 106 and 107. Each group has, by way of example, 1024 contacts. The contacts in each group are arranged with one contact at each intersection of a rectangular grid of rows and columns. The axes "a" of the contacts are parallel to each other and the broad side of each of the leaf spring contacts faces in the direction of arrow T. The contacts are generally indicated by lines in FIG. 7 and by dots in FIGS. 3 and 6. Due to the small size of each of the contacts 108 and the large numbers of the contacts 108**, not all of the contacts are indicated for simplicity.

The contact mounting plates 106 and 107 are affixed to the upper surface of the main frame plate 104 by screws (not shown). The main frame plate 104 has two openings 146 and 148 (FIG. 6) through which the lower ends 110 of the contacts 108 extend and are exposed for connection to wires by wire wrapping, soldering or the like. Additionally the contact mounting plates 106 and 107 are aligned on the main frame plate 104 so that each of the contacts 108 and the bars 116 extend through one of four openings 120, 122, 124 and 126 (FIG. 3) provided in the plate forming the upper surface 140 of the assembly interface frame 100.

Figure 3:
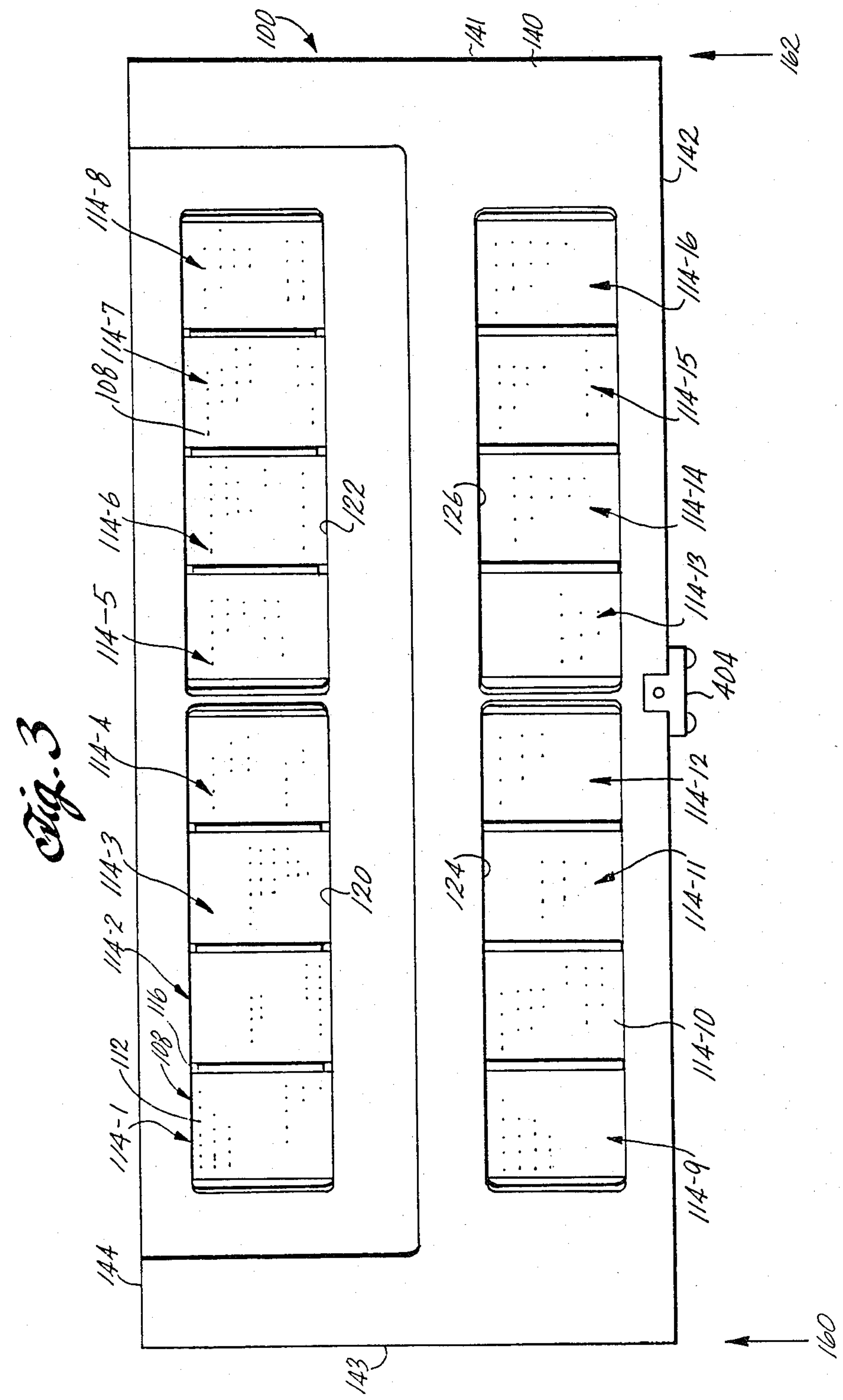
FIG. 3 is a top plan view of the actuable interface assembly.

Carrier moving means (similar to that depicted schematically at 32 and 34 of FIG. 2) is provided for moving the carrier including the main frame plate 104 and the contact mounting plates 106 and 107. The carrier moving means includes a carrier moving portion 160 located at the left hand side 143 and a carrier moving portion 162 located at the right hand side 141 of the interface assembly as seen in FIGS. 3, 4 and 6.

Figure 4:
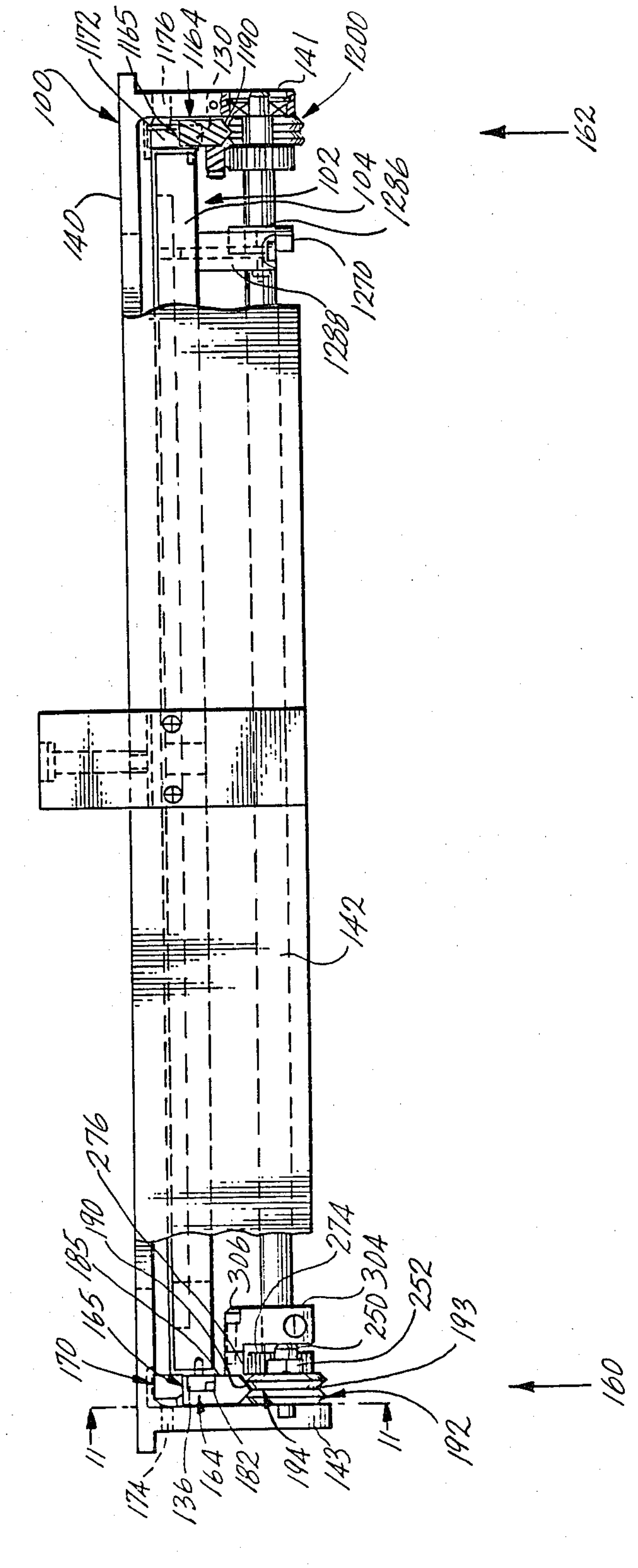
FIG. 4 is a front elevation view of the actuable interface assembly of FIG. 3 taken from the lower side of FIG. 3; portions of the assembly interface frame have been broken away (the right side to a greater depth than the left side), some of the internal parts have been removed, and some of the parts are shown in cross-section in order to provide a better understanding of the present invention.
Figure 5:
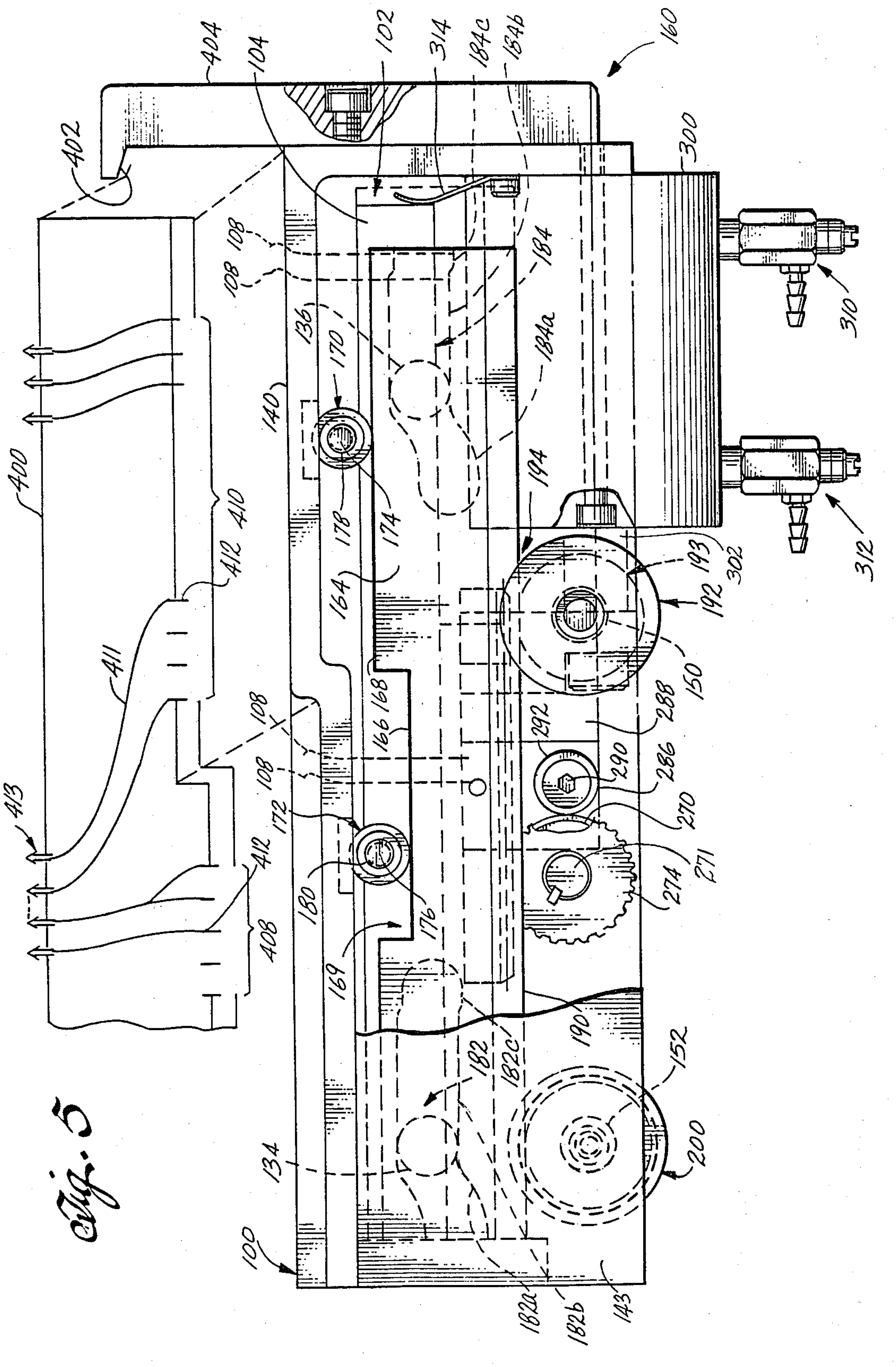
FIG. 5 is a side elevation view of the actuable interface assembly taken from the left in FIG. 4; a portion of the assembly interface frame has been broken away to reveal the internal portions of the actuable interface assembly, a portion of an interchangeable test head is shown schematically to illustrate how it is mounted and used with the actuable interface assembly.
Figure 10:
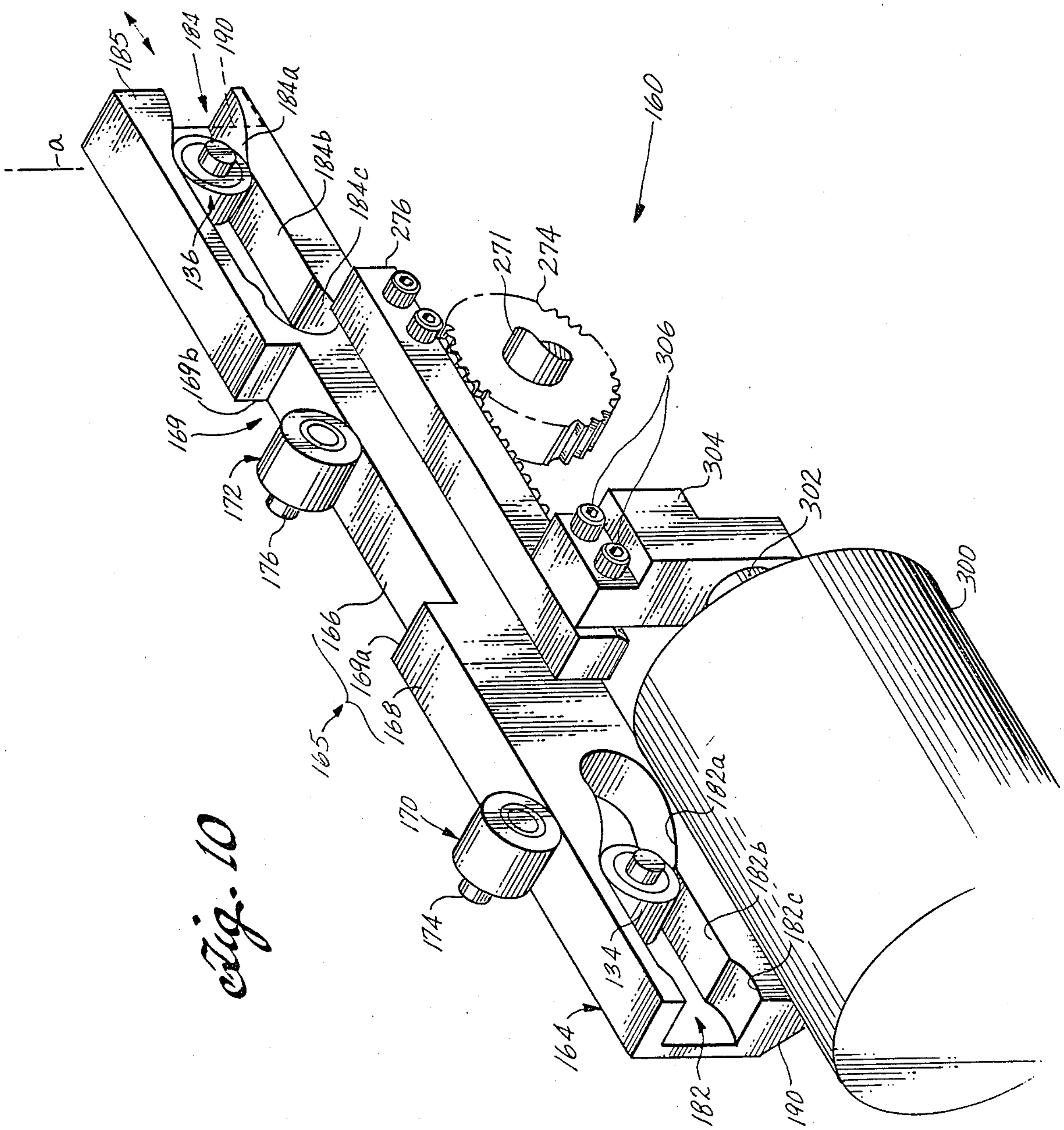
FIG. 10 is a perspective and elevation view of the cam bar, the guide rollers, the cam followers, the pancake cylinder, the actuator mount, the spur gear and the rack gear taken along the lines 10—10 of FIG. 6.

Refer now to FIGS. 4, 5, 6 and 10 and consider first the carrier moving portion 160. The carrier moving portion 160 includes a left cam bar 164, also known as a cam member. The left cam bar 164 is elongated from left to right as seen in the side elevation view of FIG. 5. Referring to FIGS. 4, 5 and 10, the left cam bar 164 includes an upper bearing 165 including bearing surfaces 166 and 168 (FIGS. 4 and 5). The bearing surface 166 is formed at the bottom of a recess 169 formed in the upper edge of the cam bar.

The upper bearing of the cam bar 164 is supported and guided by two left guide rollers 170 and 172. The left guide rollers 170 and 172 are rotatably mounted on shafts 174 and 176, respectively, by means of ball bearings 178 and 180, respectively (FIG. 5). The shafts 174 and 176 are in turn affixed in the upper portion of the plate forming the left side 143 of the interface frame 100 (FIGS. 4 and 5).

The cam bar 164 includes a front cam 182 and a rear cam 184 (FIGS. 5 and 10). The cams 182 and 184 are slots machined part way into the cam bar from the inner side 185 of the cam bar (FIGS. 4,10). Each of the cams has a first cam portion, indicated at 182*a* and 184*a*, which extends generally at an acute angle to the axis "a" of the contacts 108. The direction of the axis of the contacts 108 is generally depicted in FIG. 10 by broken line "a". Each of the cams 182 and 184 has a second portion which extends generally in a transverse direction to the axis "a" of the contacts 108. The first cam portions of the cams 184 and 182 are depicted at 184*a* and 182*a* whereas the second cam portions of the cams are depicted at 184*b* and 182*b*.

The cam followers 134 and 136, which are mounted on near the left hand side 143 of the main frame plate 104 in FIGS. 4 and 6 and at the right as seen in FIG. 7, extend into the slots for the cams 182 and 184, respectively. The cam follower 134 follows in sequence the cam portions 182*a*, 182*b* of the cams 182. Similarly the cam follower 136 follows in sequence the cam portions 184*a*, 184*b* of the cam 184.

The recess 169 in the upper bearing 165 of the cam bar 164 (FIGS. 5 and 10) forms a front stop 169*a* and a rear stop 169*b* which engage the left guide roller 172 and thereby limit the extent of movement of the cam bar 164.

The cam bar 164 has a lower bearing 190 (FIGS. 4, 5, 6, 10). A roller referred to as a dual V guide 192 is provided for supporting and rolling along the lower bearing 190. Significantly, the lower bearing 190 and the dual V guide 192 form an interlock 194 between the dual V guide 192 and the bearing 190. As best seen in FIGS. 4 and 5 the interlock interface 194 is in the form of a V-shaped cross-section or edge in cam bar 164 which extends into a V-shaped recess 193 extending around the outer periphery of the dual V guide 192. To be explained in more detail, the dual V guide is mounted on ball bearings and its axis of rotation is connected to the side plate left side 143 (FIGS. 4, 5 and 6) of interface frame 100. The spacing between the left guide rollers 170 and 172 and the dual V guide 192 is such that a force is applied therebetween through the cam member, supporting and guiding the cam member. Significantly, the interlock interface 194 between the dual V guide 192 and the bearing 190 prevents the cam member from moving relative to the dual V guide 192 transverse to the straight line direction of movement of cam bar 164. As a result the left guide rollers 170 and 172 in cooperation with the dual V guide 192 guide the cam bar along a substantially straight line. Preferably the left guide rolles 170 and 172 are positioned equal distances on opposite sides of the dual V guide 192 to thereby achieve optimum balance about the dual V guide 192.

Preferably a second dual V guide 200 is positioned to the rear of the interface assembly. The dual V guide 200 is identical to the dual V guide 192 and rolls along the bearing 190. Similar to the dual V guide 192 and the bearing 190, the V-shaped cross-section of the bearing 190 and the V-shaped recess around the outer periphery of the dual V guide 200 form an interlock interface, assisting in guiding the cam member in a straight line.

Alternate arrangements for the interlock interface between the lower bearing of the cam bar and the corresponding roller will be apparent to those skilled in the art. Referring to FIGS. 17–21, by way of example, the roller may have a generally concave groove 204 around its outer periphery and the lower bearing on the cam bar may have a generally convex lower edge 206 engaging the groove 204 as depicted in FIG. 17; the roller may have a generally notch shaped groove 208 around its outer periphery and the lower bearing of the cam bar may have a generally rounded cross-section 210 fitting in the notch shaped groove 208 as depicted in FIG. 18; the roller may have an outwardly extending V-shape cross-section 212 whereas the lower bearing of the cam bar may have a V-shaped groove 214 into which the V-shape 212 of the roller extends; the roller may have a convex outer cross-section 216 whereas the lower bearing of the cam bar may have a generally concave groove 218 into which the convex cross-section 216 of the roller extends (FIG. 20); the lower bearing of the cam bar may have a notch 222 into which a roller of various size or shape extends as depicted at 220 in FIG. 21.

The dual V guides 192 and 200 are adjustable in a vertical direction as seen in FIGS. 4 and 5. Referring to FIGS. 4, 6, 8 and 9, the dual V guide 192 is affixed to the side plate at the left side 143 of the interface frame 100 by means of a machine screw 250 which extends through the center of dual V guide 192. An eccentric dual V guide adapter 252 has a bore 254 which extends around the screw 250 and through the center of the dual V guide 192. The bore 254 through which the screw 250 extends is eccentrically positioned within an annular extension of the eccentric dual V guide adapter. With this arrangement it is possible to adjust the relative position of the dual V guide 192 vertically as seen in FIG. 4 relative to the axes of rotation of the guide rollers 170 and 172 simply by rotating the dual V adapter 252.

The dual V guide 200 has a machine screw 260 and an eccentric dual V guide adapter 262 (FIG. 6) identical to 250 and 252 which permits adjustment of the dual V guide 200 in a vertical direction as seen in FIG. 5.

Significantly, to reduce friction and thus reduce the forces required to move the cam bar 164, the guide rollers 170 and 172 and in addition to dual V guides 192 and 200 are mounted on ball bearings 178, 180, 150 and 152, respectively as generally depicted in FIG. 5. As a result, the guide rollers and the dual V guides form a very low friction support and guide for the cam bar 164.

Cam parts are provided for interacting with and thereby moving the main frame plate 104 (FIG. 6) and hence each of the contacts 108 in the direction T indicated in FIG. 7. The cam parts (FIGS. 6, 11, 12, 13) include a cam part in the form of a variable radius uniform accelerator cam 270 which is coupled to the movement of the cam bar 164 by means of a cam shaft 271, a spur gear 274 (FIG. 6) and a linear gear rack 276. The gear rack 276 is connected by means of machine screws onto the side of the cam bar 164. The cam shaft 271 is rotatably mounted in ball bearings 280 and 282 (FIG. 6) which bearings are affixed in the side plates at the left side 143 and the right side 141 of the interface frame 100. The second cam part or cam follower 286 is mounted on a left bearing support 288 which in turn is affixed to the under side of the main frame plate 104 (FIGS. 5, 6). As best seen in FIG. 5, the cam follower 286 is mounted on the left bearing support 288 by means of a machine screw 290 and includes an eccentric sleeve 292. As a result the sleeve 292 can be rotated so as to adjust the position of the surface thereof in contact with the uniform accelerator cam 270, and as a result adjust the amount of movement of the carrier, including the main frame plate 104 and the contacts 108, in the transverse direction "T" (FIG. 7).

An actuator system is provided in the left carrier moving portion 160 for permitting automatic actuation of the cam bar 164 and thereby automatic actuation of the main frame plate 104 and each of the contacts 108 in the directions A and T as depicted in FIG. 7. To this end, and referring to FIG. 10, an air actuated pancake cylinder 300 has its output shaft 302 connected to an actuator mount 304 which in turn is affixed by means of machine screws 306 to the linear gear rack 276. The pancake cylinder 300 is a conventional air actuated cylinder which actuates its output shaft 302 to the right as seen in FIG. 10, and to the left as seen in FIG. 5, when air pressure is applied to needle valve 310 and which actuates output shaft 302 to the left as seen in FIG. 10 and to the right as seen in FIG. 5 when air pressure is applied to needle valve 312.

The foregoing description has been directed principally to the left carrier moving portion 160. The right carrier moving portion 162 of the carrier moving means is essentially identical and a mirror image of the left carrier moving portion and interacts and operates essentially the same. The parts of the right carrier moving portion 162 will not be described in detail other than to make reference to the parts which correspond to the left carrier moving portion described hereinabove. The parts of the right carrier moving means and the corresponding parts of the left carrier moving portion 160, which are essentially the same, are as follows:

| "Left" parts of carrier moving portion 160 | "Right" parts of carrier moving portion 162 |
|---|---|
| 164 | 1164 |
| 165 | 1165 |
| 170 | 1170 |
| 172 | 1172 |
| 174 | 1174 |
| 176 | 1176 |
| 190 | 1190 |
| 192 | 1192 |
| 194 | 1194 |
| 200 | 1200 |
| 250 | 1250 |
| 252 | 1252 |
| 260 | 1260 |
| 262 | 1262 |
| 270 | 1270 |
| 274 | 1274 |
| 276 | 1276 |
| 286 | 1286 |
| 288 | 1288 |
| 290 | 1290 |
| 300 | 1300 |
| 302 | 1302 |
| 304 | 1304 |
| 310 | 1310 |
| 312 | 1312 |

The right uniform accelerator cam 1270 and the right spur gear 1274 are affixed to and rotate with the cam shaft 271 as seen in FIG. 6. Also it will be understood that the cams in the right cam bar are facing the cams in the left cam bar in order to permit cam followers 130 and 132 (FIG. 7) to follow the right cam portions corresponding to left cam portions 182*a*, 182*b* and 184*a*, 184*b*, respectively. For each part of the left carrier moving means 160 there is a corresponding part which is essentially the same as in the right cam carrier means 162, although for simplicity each part of the right carrier moving means is not explicitly shown in the drawings.

Consider now the operation of the interface assembly as depicted in FIGS. 4–10. Referring to FIG. 5 an interchangeable test head 400 is selected which has an array of spring probes 413 for probing the desired test points on a circuit board to be tested. As schematically indicated in FIG. 5, the spring probes 413 have the bottom or lower end of each electrically connected by a conductor 411 to a separate one of contacts in arrays 410 and 408. The contacts in arrays 410 and 408 are actually cantilever mounted in non-conduction plates located at the lower side of test head 400.

The array 410 includes an individual leaf spring contact 412 for each of the contacts 108 (hidden lines in FIG. 5) in groups 114–1 through 114–8 (FIGS. 3 and 7) in the contact mounting plate 106. Similarly, the array 408 includes an individual leaf spring contact 412 for each of the contacts in the groups 114–9 through 114–16 in the contact mounting plate 107. The contacts 108 in mounting plate 106 can be distinguished from those in mounting plate 107 in that the former are higher up than the latter in FIG. 5.

After the interchangeable test head 400 is moved down and to the right as seen in FIG. 5 and is positioned under notch 402 of alignment bar 404 in engagement with the upper side 140 of the interface frame 100, each of the contacts 412 is positioned slightly above and in front of the wide side of the corresponding leaf spring 108. It will be understood that this condition exists so long as the cam bars are deactuated and hence the carrier, including main frame plate 104 and contact mounting plates 106 and 107 (FIGS. 6, 7) are in the deactuated condition wherein these parts are completely down and to the left as viewed in FIG. 5. For purposes of illustration FIG. 5 has been shown in the partially actuated condition wherein the left cam bar 164 has been partially moved to the left, the left cam followers 134 and 136 have risen to the upper end of cam portions **182*a* and 184*a*, and therefore the contacts 108 have been brought into an opposing position with the corresponding contacts 412** in an interchangeable test head.

Consider the operation of the interface assembly starting from the initial condition using FIGS. 11-16. In the following discussion only the left carrier moving portion 160 is discussed, for brevity. However, it will be understood that the right carrier moving portion 162 is actuated and operates in essentially the same manner and at the same time.

Figure 11:
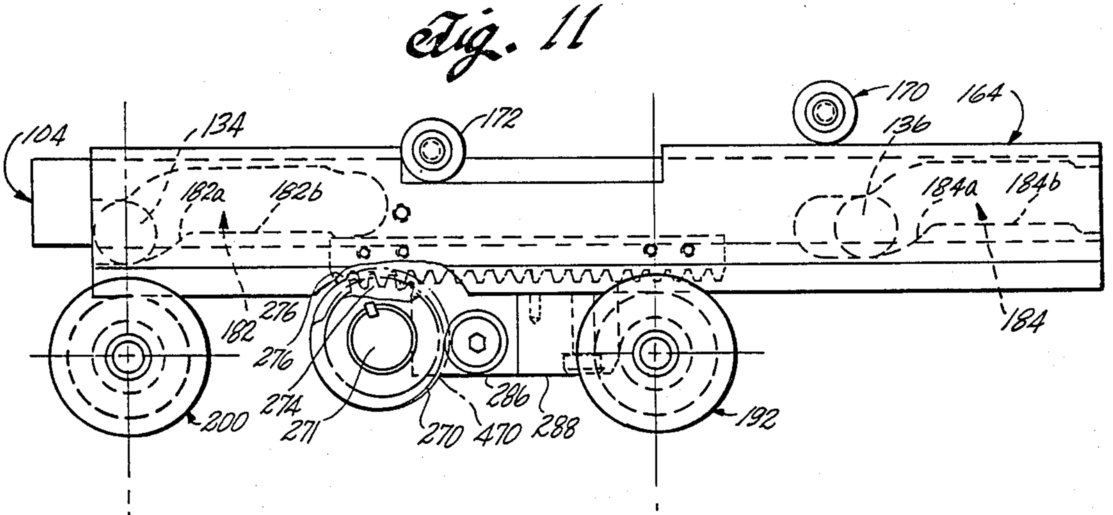
FIGS. 11, 12 and 13 are side elevation views of the cam bar, the rollers, the dual V guide and the bearing support in, respectively, the initial, partially actuated and fully actuated positions.

FIGS. 11 and 14 depict the deactuated condition before air pressure has been applied to the pancake cylinder 300. In this condition the left cam followers 134 and 136 are positioned down and to the left at the lower end of cam portions **182*a* and 184*a***.

Subsequently the pancake cylinder 300 is actuated, causing the output shaft 302 to move from the position depicted in FIG. 14 to the position depicted in FIG. 15, thereby moving the cam bar 164 from the positions indicated in FIGS. 11,14 to the positions indicated in FIGS. 12,15. During this moving of the cam bar 164, the rollers 170, 172 and 192 guide the cam bar in a substantially straight line to the left as seen in these figures. As this movement of the cam bar takes place, the left cam followers 134 and 136 follow along the cam portions **182*a* and 184*a*, rising and thereby lifting the carrier including the main frame plate 104 and the contacts 108 vertically to the position depicted in FIG. 12**.

Figure 12:
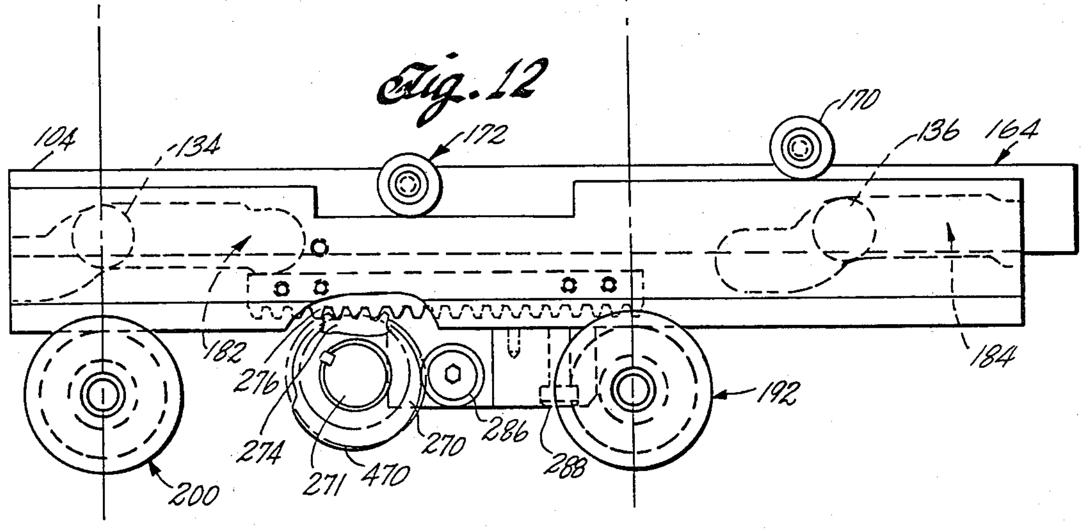

During this movement of the cam bar, the linear rack 276 rotates the spur gear 274 and thereby rotates cam shaft 271 and the linear accelerator cam 270 from the position depicted in FIG. 11 to that depicted in FIG. 12. The linear accelerator cam 270 has a variable radius. The variable radius can be seen in relation to the fixed radius line 470. However, the portion of the linear accelerator cam 270 which engages cam follower 286 during the rotation from FIG. 11 to FIG. 12 has a constant radius. As a result, the cam follower 286 remains fixed in the position depicted in FIG. 11 during the previously described motion of the cam bar. In this regard the leaf springs 314 (FIG. 5) and 316 apply pressure to the main frame plate 104, causing the cam follower 286 to remain in tight contact with the linear accelerator cam 270.

Figure 13:
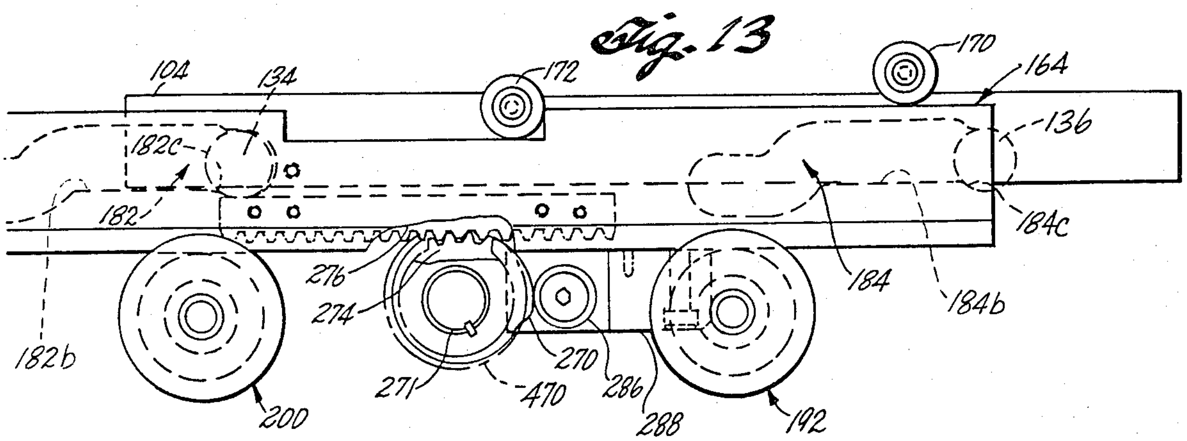

The actuation by the pancake cylinder 300 continues to the position depicted in FIG. 16, causing the output shaft 302 to move to the position depicted in FIG. 16 and causing the cam bar 164 to move to the position depicted in FIGS. 13 and 16. At this point the cam bar is in a fully actuated condition. During this movement of the cam bar 164 the cam followers 134 and 136 follow along the cam portions **182*b* and 184*b*. During this movement the linear accelerator cam 270 continues to rotate. However, as can be seen with respect to the constant radius line 470, the uniform accelerator cam 270 has a change in radius which acts against the cam follower 286, causing it to move to the right as seen in FIG. 13 and hence move the main frame plate 104, the contacts 108 and the cam followers 134 and 136 to the right. This latter movement causes the contacts 108 to move into electrical engagement with the contacts 412 on the interchangeable test head 400 (FIG. 5**).

It will be noted that the cam portions **182*b* and 184*b* have slightly lower portions 182*c* and 184*c*, respectively. The lower portions 182*c* and 184*c* allow the cam followers 134 and 136 to drop slightly toward the end of the movement along cam portions 182*b* and 184*b*. As a result after electrical engagement is made between contacts 412 and 108, the main frame plate and hence the contacts 108 move downwardly, providing a slight wiping action between the contacts 412**.

Although an exemplary embodiment of the invention has been disclosed for purposes of illustration, it will be understood that various changes, modifications and substitutions may be incorporated into such embodiment without departing from the spirit of the invention as defined by the claims appearing hereinafter.

What is claimed:

1. A low insertion force actuable interface assembly having a carrier mounting an array of electrical contacts with axes of the contacts substantially parallel to each other so that each contact extends to a free end and a carrier moving means, the carrier moving means comprising at least one movable cam member guided for movement in a substantially straight line, the cam member comprising first and second cam portions, a cam follower connected to the carrier and positioned for following the first and second cam portions for thereby guiding the movement of the carrier during movement of the cam member, a first cam part connected for movement with the cam member, such movement of the cam member causing the cam follower to follow in sequence the first and second cam portions, the cam follower in following the first cam portion causing the carrier to move the contacts substantially parallel with the axes thereof, the second cam part forcing the first cam part to move the carrier substantially transverse to the axes of the contacts while the cam follower follows the second cam portion, the improvement comprising:

guide means for supporting and guiding the movable cam member along such substantially straight line comprising at least one first bearing on the cam member, at least one second bearing on the cam member, at least one first roller positioned for supporting and rolling along the first bearing, at least one second roller positioned for supporting and rolling along the second bearing, an interlocked interface between the first roller and the first bearing for substantially preventing movement of the cam member transverse to such substantially straight line, the first and second bearings being at least partially oppositely facing, the first and second rollers being positioned with respect to the first and second bearing for supporting and guiding the cam member along such substantially straight line.

2. A low insertion force actuable interface assembly according to claim 1 wherein the interlock comprises a recess in one of the first roller and the first bearing elements into which the other of said elements extends.

3. A low insertion force actuable interface assembly according to claim 2 wherein the recess extends around the perimeter of the first roller.

4. A low insertion force actuable interface assembly according to claim 1 wherein there is a third rotatably mounted roller positioned for rolling along one of said first and second bearings during movement of the cam member, two out of three of said rollers being positioned for rolling along one of said first and second bearings and the remaining roller being positioned for rolling along the other of said first and second bearings, said rollers being positioned in a triangular relationship wherein the axes of rotation of the two rollers for one of said first and second bearings are positioned on opposite sides of a line normal to said bearings through the axis of rotation of the remaining roller.

5. A low insertion force actuable interface assembly according to claim 4 wherein the axes of rotation of the two rollers for one of said bearings are spaced substantially equal distances on opposite sides of such line through the axis of rotation of the remaining roller.

6. A low insertion force actuable interface assembly according to claim 1 wherein said second bearing comprises at least one substantially flat bearing surface and wherein said second roller comprises a substantially cylindrical shaped bearing surface for rolling along said at least one surface during movement of the cam member.

7. A low insertion force actuable interface assembly according to claim 4 wherein there is a fourth rotatably mounted roller for rolling along the other of said first and second bearings during the movement of the cam member.

8. A low insertion force actuable interface assembly according to claim 7 wherein the fourth roller and the other of said first and second bearings have an interlocked interface therebetween to prevent lateral movement of the cam member relative to such straight line.

9. A low insertion force actuable interface assembly according to claim 7 wherein the one of said first and second bearings of the cam member contains first and second spaced apart stops for engaging one of said rollers and to thereby limit the extent of such movement of said cam member.

10. A low insertion force actuable interface assembly according to claim 9 wherein the one of said first and second bearings comprises a depressed portion forming such first and second stops.

11. A low insertion force actuable interface assembly according to clam 1 wherein the second cam part comprises a rotatable cam.

12. A low insertion force actuable interface assembly according to claim 11 wherein the second cam part comprises a dwell portion which does not move the carrier and an accelerator portion, the accelerator portion acting against the first cam part to move the first cam part and thereby the carrier transverse to the axes of the contacts.

13. A low insertion force actuable interface assembly according to claim 12 wherein the first cam part is adjustable relative to the second cam part to thereby adjust the movement of the second cam part and thus adjust the movement of the carrier in a transverse direction to the axes of the contacts.

14. A low insertion force actuable interface assembly according to claim 1 wherein the cam follower is a roller rotatably mounted to said carrier.

15. A low insertion force actuable interface assembly according to claim 14 wherein the cam member has a side between the first and second bearings having a slot extending only partially into the side of the cam member, the slot comprising the first and second cam portions, the cam follower being rotatably positioned in and confined within said slot.

16. A low insertion force actuable interface assembly according to claim 1 comprising means for adjusting the distance between the axes of rotation of the first and second roller.

17. A low insertion force actuable interface assembly according to claim 4 comprising means for adjusting the axis of rotation of said remaining roller closer and away from the axis of rotation of said two rollers for one of said first and second bearings.

18. A low insertion force actuable interface assembly according to claim 1 wherein the second cam part comprises a rotatable cam part and the assembly comprises gear means coupled between the rotatable cam part and the cam member for rotating the rotatable cam part with movement of the cam member.

19. A low insertion force actuable interface assembly according to claim 18 comprising a rotatable shaft and wherein the rotatable cam part is connected to the shaft and the shaft is geared to the cam member.

20. A low insertion force actuable interface assembly according to claim 19 wherein the rotatable cam part comprises a dwell portion which does not move the carrier and an accelerator portion, the accelerator portion acting against the first cam part to move the first cam part and thereby the carrier transverse to the axes of the contacts.

21. A low insertion force actuable interface assembly having a carrier mounting an array of electrical contacts with axes of the contacts substantially parallel to each other so that each contact extends to a free end and a carrier moving means, the carrier moving means comprising first and second movable cam members each cam member guided for movement in a substantially straight line, the cam members being connected together for movement together in a parallel relationship, each cam member having first and second cams, each cam having a first and second cam portion, first and second cam followers for each of aforesaid cam members connected to the carrier, the first and second cam followers for the first cam member following along the first and second cam portions of a different one of the cams in the first cam member and the first and second cam followers for the second cam member following along the first and second cam portions of a different one of the cams in the second cam member for thereby guiding movement of the carrier during movement of the cam member, a first cam part connected to the carrier, a second cam part connected for movement with said cam members, such movement of the cam members causing the cam followers to follow in sequence the first and second cam portions, the first cam portion thereby causing the carrier to move the contacts substantially parallel with the axes thereof, the second cam part forcing the first cam part to move the carrier and thereby the contacts substantially transverse to the axes of the contacts while the cam followers follow the second cam portions, the improvement comprising:

guide means for supporting and guiding each of said cam members along such substantially straight line, the guide members for each of said cam members comprising at least one first bearing on the cam member, at least one second bearing on the cam member, at least one first roller positioned for supporting and rolling along the first bearing, at least one second roller positioned for supporting and rolling along the second bearing, an interlocked interface between the first roller and the first bearing for substantially preventing movement of the cam member transverse to such substantially straight line, the first and second bearings being at least partially oppositely facing, and the first and second rollers being positioned with respect to the first and second bearings for supporting and guiding the cam member along such substantially straight line.

22. A low insertion force actuable interface assembly according to claim 18 wherein the transverse direction of movement of the carrier is parallel with the direction of movement of the cam members.

* * * * *

UNITED STATES PATENT AND TRADEMARK OFFICE

CERTIFICATE OF CORRECTION

PATENT NO. : 4,405,191

DATED : September 20, 1983

INVENTOR(S) : Lyle A. Fettig

It is certified that error appears in the above-identified patent and that said Letters Patent is hereby corrected as shown below:

Col. 6, line 56 "A" should be -- T --;
col. 9, line 5 after "contacts" insert -- 108 --;
col. 9, line 38 "4 and 5" should be -- 5 and 10 --;
col. 9, line 64 "on near" should be -- near --;
col. 10, line 32 "rolles" should be -- rollers --
col. 11, line 20 "to" should be -- the --.

Signed and Sealed this

*Sixth* Day of *December 1983*

[SEAL]

*Attest:*

GERALD J. MOSSINGHOFF

*Attesting Officer* *Commissioner of Patents and Trademarks*